United States Patent [19]

Sakamoto et al.

[11] 4,374,369
[45] Feb. 15, 1983

[54] ELECTROMAGNETIC INTERFERENCE ELIMINATION FILTER

[75] Inventors: Yukio Sakamoto; Tetsuo Tanaka; Masaaki Kuboto; Masami Sugitani, all of Takefu, Japan

[73] Assignee: Murata Manufacturing Co., Ltd., Japan

[21] Appl. No.: 216,942

[22] Filed: Dec. 16, 1980

[30] Foreign Application Priority Data

Dec. 20, 1979 [JP] Japan ............................ 54-177509[U]
Dec. 28, 1979 [JP] Japan ............................ 54-184306[U]
Dec. 29, 1979 [JP] Japan ............................ 54-181679[U]

[51] Int. Cl.³ ........................ H03H 7/01; H03H 1/00
[52] U.S. Cl. ................................... 333/182; 333/12; 333/185
[58] Field of Search ............... 333/167, 168, 175, 176, 333/181–185, 12; 361/395, 397, 400–405

[56] References Cited

U.S. PATENT DOCUMENTS

3,052,824  9/1962  Tenhaken et al. ................. 361/401
3,129,396  4/1964  Germain et al. ................... 333/167
3,356,916 12/1967  Scott ................................ 361/302
3,996,416 12/1976  Lemke ........................... 361/397 X

OTHER PUBLICATIONS

"IEEE Standard Dictionary of Electrical and Electronics Terms", Wiley-Interscience, New York, 1972; Title Page and p. 527.
Chapman–"Interference Decoupling System," IBM Technical Disclosure Bulletin, vol. 3, No. 4, Sep. 1960, p. 24.

Primary Examiner—Marvin L. Nussbaum
Attorney, Agent, or Firm—Ostrolenk, Faber, Gerb & Soffen

[57] ABSTRACT

An electromagnetic interference suppression filter for use with electric circuits including a filter unit comprising a pair of capacitors provided with through holes extending through the axes thereof, respectively, a substantially U-shaped penetration shaft having its two legs fitted through the through holes, respectively, and a ferrite bead mounted on at least one of the two legs of the penetration shaft, the filter unit being mounted on a metal plate by fitting the two legs into holes provided therein, one electrode of each capacitor being conductively connected to the leg, while the other electrode thereof is conductively connected to the metal plate, respectively, the filter unit thus integrated being easily mountable on a printed circuit board or the like thereby resulting in an electromagnetic interference suppression filter of a simplified construction suitable for mass production and having high filter characteristics.

4 Claims, 13 Drawing Figures

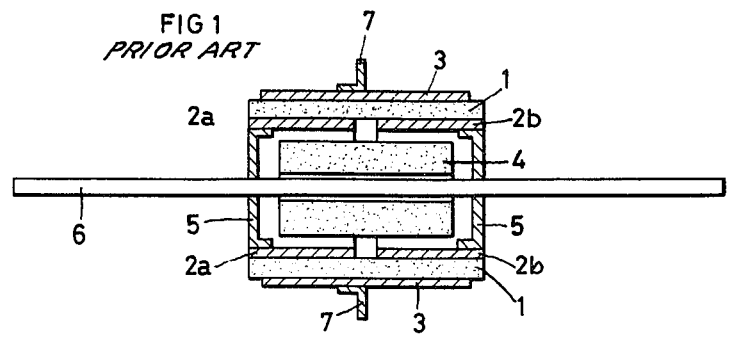
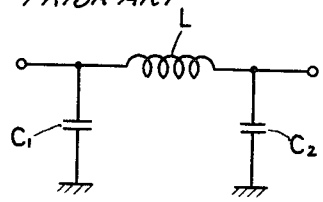
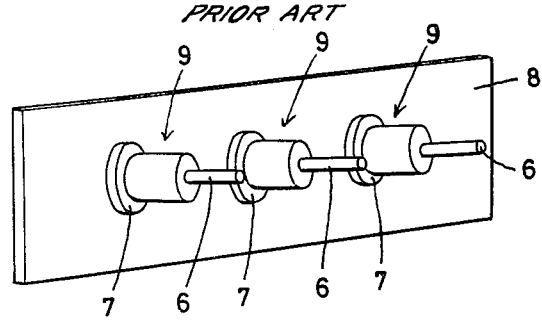
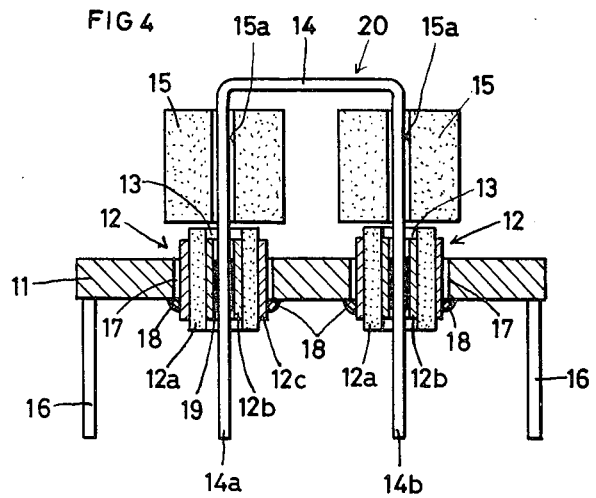

ELECTROMAGNETIC INTERFERENCE ELIMINATION FILTER

BACKGROUND OF THE INVENTION

The invention relates to an electromagnetic interference suppression filter for use by mounting on printed circuit boards or the like of various electric circuits.

In the electronic apparatus, an electromagnetic interference suppression filter is installed intermediately in the electronic circuit in order to obviate the occurrence of malfunction due to noises induced by the power source line or the signal line and to prevent the noise originating in the apparatus from affecting other equipment.

In conventional electromagnetic interference suppression filters, such as that shown in FIG. 1, two internal electrodes $2a$, $2b$ are provided on the inner periphery of a tubular dielectric 1, an external electrode 3 being provided on the outer periphery of the dielectric 1 so as to be opposed to the two internal electrodes $2a$, $2b$, a penetration shaft provided with a ferrite bead 4 being fitted through the tubular dielectric 1 so that the ferrite bead 4 may be located inside the dielectric 1, grommets 5 being fixed to the internal electrodes $2a$, $2b$ respectively, the grommets 5 being conducted to the penetration shaft 6, a metal fixer 7 being secured to the external electrode 3 by solder, thereby resulting in an $LC\pi$ type filter circuit by means of inductance formed by the ferrite bead 4, capacitance $C_1$ formed between the internal electrode $2a$ and the external electrode 3, and capacitance $C_2$ formed between the internal electrode $2b$ and the external electrode 3, as shown in FIG. 2.

When the conventional electromagnetic interference suppression filter was installed on a printed circuit board, the following process was required. The printed circuit board was provided with a hole for receiving the electromagnetic interference suppression filter, the metallic fixer 7 being soldered to the ground part of the printed circuit board after the electromagnetic interference suppression filter was directly fitted into said hole, and the penetration shaft 6 then being bent at one end thereof or a lead wire or the like being fixed thereto. The lead wire was then soldered to a predetermined part of the printed circuit board. Alternatively, as shown in FIG. 3, the electromagnetic interference suppression filter 9 was fitted into one of a plurality of holes provided on a metallic shield plate 8, the metallic fixer 7 being soldered to the shield plate 8, the shield plate 8 being soldered to the grounded part of the printed circuit board, and the penetration shaft also being soldered to a predetermined part of said printed circuit board. Thus the mounting operation was very complicated and time-consuming, and, particularly when a plurality of electromagnetic interference suppression filters were required, the complicated mounting operation was a bottleneck in production.

In the conventional electromagnetic interference suppression filter, the ferrite bead 4 was fitted inside the dielectric 1. Thus, not only did the dielectric have to have a large inside diameter but also brush coating or similar inefficient methods had to be employed in order to form the internal electrodes $2a$, $2b$ inside the dielectric 1, and the internal electrodes $2a$, $2b$ had to be electrically connected to the penetration shaft 6 by use of the grommets 5, 5, respectively. This complicated construction caused another bottleneck in mass production.

SUMMARY OF THE INVENTION

The principal object of the invention is to overcome the abovedescribed difficulties of the conventional electromagnetic interference suppression filter. The invention relates to an improved electromagnetic interference suppression filter including a filter unit comprising a pair of capacitors, a substantially U-shaped penetration shaft with its two legs extending through the capacitors respectively, and a ferrite bead fixed to at least one of the legs of the penetration shaft.

Still another object of the invention is to provide an electromagnetic interference suppression filter mountable directly on a printed circuit board or the like by means of the two legs of a substantially U-shaped penetration shaft through a very simple mounting operation.

The invention has for a second object to provide an electromagnetic interference suppression filter comprising a filter unit formable without use of any specific capacitor facilitating mass production and reducing the production cost.

Yet another object of the invention is to provide an electromagnetic interference suppression filter having improved filter characteristics by decreasing the interference between the filter units when a plurality of filter units are used in juxtaposition.

These and other objects are accomplished by improvements, combinations and arrangements of the parts comprising the invention, preferred embodiments of which are shown by way of example in the accompanying drawings and herein described in detail.

BRIEF DESCRIPTION OF THE FIGURES

FIG. 1 is a sectional view of a conventional electromagnetic interference suppression filter.

FIG. 2 is a diagram showing an equivalent circuit of the filter of FIG. 1.

FIG. 3 is a diagram showing how the filter of FIG. 1 is mounted.

FIG. 4 is a longitudinal sectional view showing a first preferred embodiment of the electromagnetic interference suppression filter according to the invention.

DETAILED DESCRIPTION OF THE PREFERRED EMBODIMENT

Figure 5:
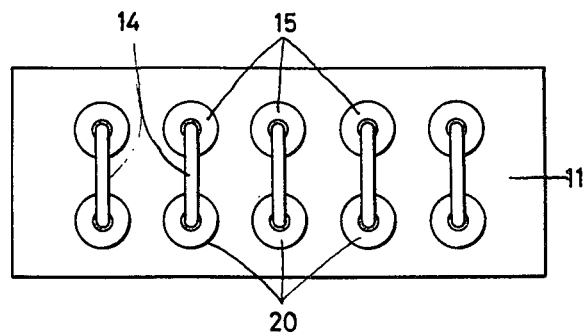
FIG. 5 is a plan view showing plural sets of filters according to FIG. 4 mounted on a metal plate.

In FIGS. 4 and 5, showing the first preferred embodiment, the numeral 11 designates an oblong metal plate, 12 designating tubular capacitors having through holes 13 extending through the axes thereof respectively, 14 designating a subsantially U-shaped penetration shaft, 15 designating ferrite beads having through holes 15a extending through the axes thereof, respectively.

On one pair of opposite sides of the metal plate 11 there are formed downwardly projecting ground terminals 16 respectively for fixing a printed circuit board. The metal plate 11 is provided with a pair of circular holes for receiving the capacitors 12 respectively.

The capacitors 12 are of the identical construction, each comprising a dielectric 12a having a through hole 13 extending through the axis thereof, an electrode 12b formed on the inner periphery of the through hole 13, and an electrode 12c formed on the outer periphery of the dielectric 12a.

The electrodes 12c of the capacitors 12 are secured to the metal plate by solder 11 at 18. The two legs 14a, 14b of the penetration shaft 14, after being fitted through the through holes 15a of the ferrite beads 15 respectively, are fitted through the through holes 13 of the capacitors 12, respectively, and are secured to the electrodes 12b respectively by solder at 19.

With the abovedescribed construction, an electromagnetic interference suppression filter of the same $LC\pi$ type as shown in FIG. 2 is obtainable by the capacity of the capacitors 12 and the inductance by the ferrite beads 15. Since both of the legs 14a, 14b of the penetration shaft 14 of this electromagnetic interference suppression filter project on the side of the ground terminals 16 of the metal plate 11 respectively, as is clear from FIG. 4, the filter is mountable on a printed circuit board (not shown) by fitting the legs 14a, 14b together with the ground terminals 16 through the holes of the printed circuit board and soldering them to predetermined parts thereof. The mounting and wiring operation, therefore, is very much simplified.

A multiplicity of electromagnetic interference suppression filter units 20 can be synchronously mounted on the printed circuit board as shown in FIG. 5, illustrating the use of filters of the first preferred embodiment, thereby permitting miniaturization of the set.

Figure 6:
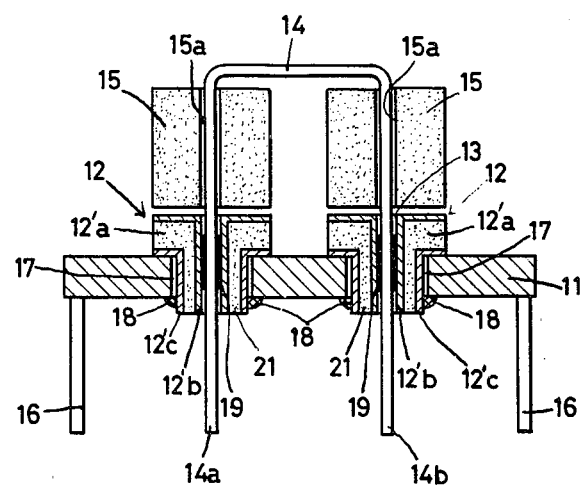
FIG. 6 is a longitudinal sectional view showing a modified example of the first preferred embodiment.

Apart from the basic embodiments of the invention described in detail hereinabove, the capacitor 12 may be replaced by a dielectric 12'a (see FIG. 6) having a projection on one side fittable into a circular hole provided on the metal plate 11 and covered with an electrode on the whole of its surface except the peripheral surface and the projection, as shown in FIG. 6 as a modified example. In FIG. 6, 12'b designates one electrode for capacity 12, 12'c designating the other electrode. Thus electrode 12'b is to be secured to the penetration shaft 14, while the other electrode 12'c is to be secured to the metal plate 11, respectively by solder.

Though not illustrated, the two legs 14a, 14b of the penetration shaft 14 may be coiled together or the inductance possessed by the penetration shaft may be utilized for filtering.

The ground terminals 16 as fixing elements are not necessarily indispensable; the metal plate may be connected directly to the ground electrode of the printed circuit board.

A second preferred embodiment will now be described in detail in reference to FIGS. 7 to 9.

The second embodiment enables the reduction crosstalk due to electromagnetic inductive coupling between the ferrite beads of adjacent filter units when a plurality of modules are mounted on the metal plate. The same parts as in the first embodiment shown in FIGS. 4 to 6 are designated by the same reference numerals without specific description.

The penetration shaft 14 constitutes a filter unit 20 together with the capacitors 12 and the ferrite bead 15. The two legs 14a, 14b of the penetration shaft 14, with one leg 14a thereof being preliminarily fitted through the through hole 15a of the ferrite bead 15 the same as in the case of FIG. 4, are fitted through the through holes 13 of the capacitors 12 and soldered to the electrodes 12b of the capacitors 12 at 19, respectively.

The filter unit 20 is provided at least in two sets. They are mounted in juxtaposition on the metal plate 11 so that the two legs 14a, 14b are substantially parallel to each other.

On a pair of opposite sides of the metal plate 11 there are formed a pair of ground terminals 16 for use in fixing a printed circuit board by punching or the like synchronously with the punching of the metal plate 11, the ground terminals 16 being bent downwardly, at least two pairs of circular holes 17 for receiving the capacitors 12 of the filter unit 20 being provided on the metal plate 11 in conformity with the number of the filter units 20.

The capacitors 12 of the filter unit 20 are fitted into the circular holes 17 of the metal plate 11, the electrodes 12a of the capacitors 12 being soldered to the metal plate 11 at 18.

Similarly, a plurality of filter units 20 are mounted in juxtaposition on the metal plate 11, the ferrite beads 15 of adjacent filter units 20 being located to alternate sides of the plate 11.

The electromagnetic interference suppression filter described hereinabove comprises a plurality of filter units 20 having the same $LC\pi$ type circuit system as in FIG. 2. As is apparent from FIG. 7, the ferrite beads 15 each two adjacent filter units 20 are sufficiently spaced from each other to minimize the electromagnetic inductive coupling between the adjacent filter units 20 and the consequential cross-talk.

The inductance of the filter units 20 can conveniently be increased by fitting a ferrite bead onto both legs 14a, 14b of the penetration shaft 14. This, however, results in reducing the distance between the adjacent ferrite beads and increases of electromagnetic inductive coupling therebetween.

In order to obviate the difficulty, it is necessary to increase the distance between the adjacent filter units 20 at the price of integration density. This necessarily makes the set relatively large, contrary to the desideration of integrating the parts for the miniaturization of the set.

According to the invention, therefore, one ferrite bead is applied to each of the juxtaposed filter units 20, such ferrite beads being disposed alternately so as to increase the distance between them, thereby not only improving the integration density but also minimizing the occurrence of electromagnetic inductive coupling.

Figure 8:
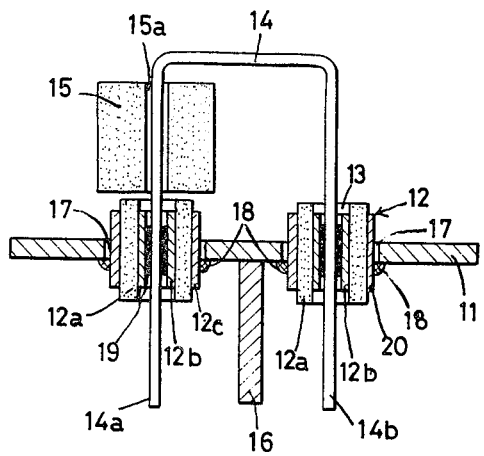
FIG. 8 is a sectional view taken along the line VIII—VIII of FIG. 7.

Since both legs 14a, 14b of each penetration shafts 14 project on the side of the ground terminals 16 of the metal plate 11 as shown in FIG. 8, the filter units 20 can be mounted on a printed circuit board (not shown) by fitting the legs 14a, 14b together with the ground terminals 16 through respective holes provided on the printed circuit board and soldering them to predetermined parts of the printed circuit board. Thus the mounting operation can be very much simplified.

Figure 7:
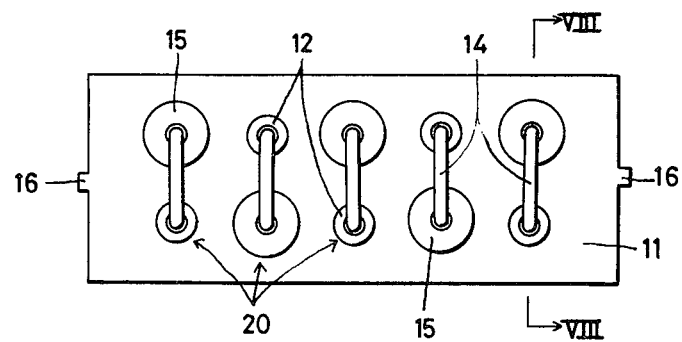
FIG. 7 is a plan view showing a second preferred embodiment of the electromagnetic interference suppression filter according to the invention.

The electromagnetic interference suppression filter of FIGS. 7 and 8 is assembled as follows. The ferrite beads 15 are alternately fitted onto one of the legs, for example, leg 14a, of each penetration shaft 14, respectively, both legs 14a, 14b of each penetration shaft 14 being fitted through two capacitors 12, 12 and the capacitors 12, 12 being fitted into the circular holes 17, 17 of the metal plate 11, the whole being submerged in a flow soldering bath. The process is extremely simple.

Figure 9:
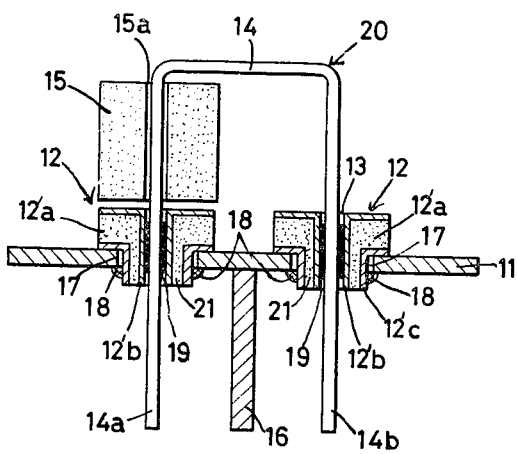
FIG. 9 is a longitudinal sectional view showing a modified example of the second preferred embodiment.

The capacitor 12 may be replaced by a disk-shaped dielectric 12 having a projection 21 fittable into the circular hole 17 of the metal plate 11 as shown in FIG. 9, an electrode being applied to the whole of the outer surface of the dielectric 12, except its peripheral face and the end face of the projection 21, in the same manner as in the example shown in FIG. 6.

Next, a third embodiment will be described in detail in reference to FIGS. 10 to 13.

The third embodiment has a shield member provided on one side of the metal plate to reduce the interference between the legs of the penetration shaft with a view to improving the filter characteristics. The same parts as in the second embodiment shown in FIGS. 4 to 9 are designated by the same reference numerals without specific description.

The metal plate 11 for mounting the filter unit thereon is oblong, an elongated shield terminal 22 being projected downwardly from the center of the metal plate 11, circular holes 17 for receiving the filter unit being provided on both sides of the location at which the shield terminal projects beyond the metal plate 11, respectively.

Figure 10:
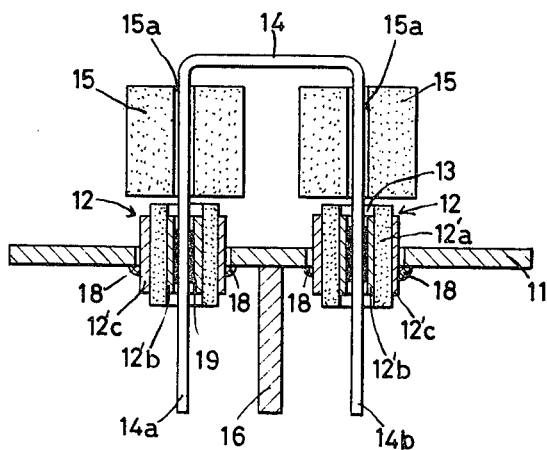
FIG. 10 is a longitudinal sectional view showing a third preferred embodiment of the electromagnetic interference suppression filter according to the invention.

In the electromagnetic interference suppression filter shown in FIG. 10, the two legs 14a, 14b are shielded from each other by the elongated shield terminal 22 interposed therebetween. As a result, the maximum attenuation amount is improved by about 10 dB compared with the case without the shield terminal 22. The location of the shield terminal 22 is not limited to the one illustrated in the drawing.

Figure 11:
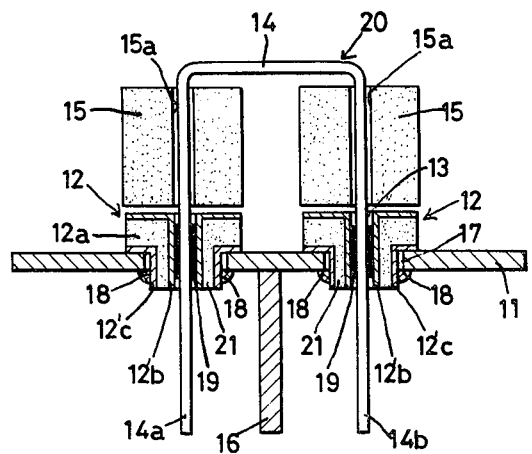
FIG. 11 is a longitudinal sectional view of a modified example of the filter of FIG. 10.

FIG. 11 shows an embodiment in which the capacitor of the embodiment of FIG. 10 is replaced by the one shown in FIGS. 6 and 9, the electrodes 12'b, 12'c thereof being soldered to both legs 14a, 14b of the penetration shaft 14 and the metal plate 11, respectively. This also yields an LCπ type electromagnetic interference suppression filter having the same function as that of the filter shown in FIG. 10.

Figure 12:
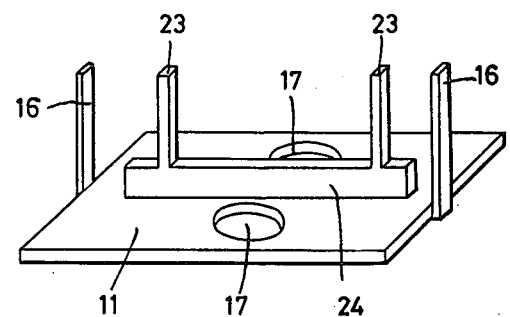
FIG. 12 is a perspective view of a metal plate for use with the filter of FIG. 10.

In the third embodiment shown in FIGS. 10 and 11, if the metal plate 11 is provided with a ground plate 24 having projecting terminals 23 for soldering in place of the elongated shield terminal 22, as shown in FIG. 12, the legs can be shielded substantially completely, thereby further improving the characteristics of the electromagnetic interference suppression filter.

If the ground plate 24 is adapted to be directly securable to the ground electrode of the printed circuit board, the terminals 23 for soldering can be dispensed with.

Figure 13:
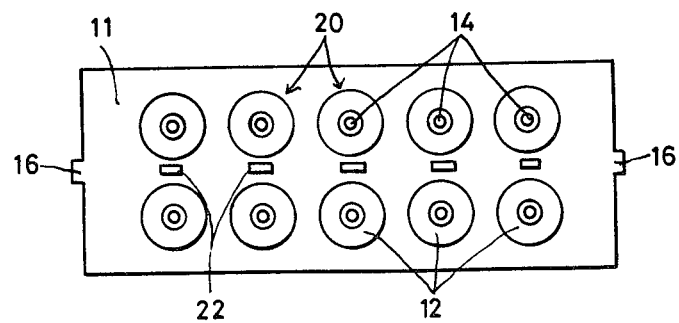
FIG. 13 is a plan view showing the filters of the third embodiment mounted in a plurality of sets.

According to the third embodiment, as shown in FIG. 13, a plurality of filter units 20 an be mounted in juxtaposition on a metal plate 11. Though the elongated shield terminal 22 is shown fixed to each of the filter units 20, this arrangement is not necessarily prerequisite.

According to the invention, as described hereinbefore, the filter unit can be mounted on the printed circuit board with simplicity by arranging that the two legs of the U-shaped penetration shaft project on the same side of the metal plate to which the capacitors are secured. In addition, the required number of electromagnetic interference suppression filters can synchronously be mounted on the printed circuit board by providing a plurality of such filters on the metal plate.

Moreover, when a plurality of filter units are mounted on the metal plate, is is so adapted that the ferrite bead fitted onto the leg of each penetration shaft is sufficiently spaced from the adjacent ferrite beads to minimize electromagnetic inductive coupling between the adjacent ferrite beads and the consequential crosstalk.

Furthermore, the specific capacitor formed with two internal electrodes on the inner periphery of a tubular dielectric as in the case of the conventional filter is not used in the electromagnetic interference suppression filter according to the invention. Therefore, there is no necessity of providing grommets or the like for connecting the internal electrodes to the penetration shaft. Thus, the invention has a great advantage in that it not only simplifies the construction and the assemblying operation but also facilitates mass production to a great extent.

The invention has a further advantage in that, since a shield member is interposed between the two legs of the substantially U-shaped penetration shaft, the interference between the two legs is reduced, thereby improving the filter characteristics and decreasing the stray capacitance between the capacitors.

Although the present invention has been described in connection with the preferred embodiments thereof, many variations and modifications will now become apparent to those skilled in the art. It is preferred, therefore, that the present invention be limited not by the specific disclosure herein, but only by the appended claims.

What is claimed is:

1. An electromagnetic interference supression filter, comprising:
   (A) grounding means comprising a metal plate having a plurality of holes formed therein, said holes in said metal plate being disposed in first and second rows, each said hole of said first row being aligned with and adjacent to a respective said hole of said second row to form a hole pair;
   (B) a plurality of filter units equal in number to the number of hole pairs, each of said filter units comprising:
      (1) a generally U-shaped penetration shaft having a central part and having two legs extending from said central part generally parallel to each other;
      (2) first and second capacitors each having a through hole formed therein, said through hole of each said capacitor receiving a respective portion of said penetration shaft; each said capacitor having a respective first electrode and a respective second electrode, said first electrode of each said capacitor being in electrical contact with the respective said portion of said penetration shaft which is received in said through hole of the respective said capacitor, said second electrode of each said capacitor being in electrical contact with said grounding means; and
(3) induction means disposed in electrical contact with said penetration shaft at a location intermediate said first and second capacitors;
(C) one said leg of said penetration shaft of each said filter unit being received in a respective said hole in said first row and the other said leg of said penetration shaft of each said filter unit being received in the respective said adjacent hole of said second row;
(D) said induction means having a through hole formed therein and receiving in its said through hole one said leg of said penetration shaft of the respective said filter unit; each said filter unit being so oriented that every second filter unit has its respective said induction means located on a penetration shaft leg that is received in a hole in said first row and the remaining said filter units have their respective induction means located on a penetration shaft leg that is received in a hole in said second row; said holes in said metal plate being defined at such locations that the respective said induction means of said plurality of filter units are sufficiently spaced from each other to prevent the occurrence of any substantial inductive coupling between them.

2. An electromagnetic interference suppression filter as claimed in claim 1, wherein said inductance means comprises a ferrite bead having a through hole therein and receiving in its said through hole a portion of its respective said penetration shaft that is intermediate its respective said first and second capacitors.

3. An electromagnetic interference suppression filter comprising:
(A) a metal plate having first and second rows of holes formed therein, each row having N holes, N being an integer greater than 1, each hole of said first row being aligned with and adjacent to a respective hole of said second row so as to form N pairs of holes;
(B) N filter units, each said filter unit comprising:
(1) first and second capacitors each having respective first and second electrodes;
(2) a generally U-shaped penetration shaft opposite legs of which are connected to said first electrode of a respective one of said first and second capacitors; and
(3) a ferrite bead having a through hole formed therein, one leg of said penetration shaft extending through said through hole;
(C) each of said filter units being associated with a respective said pair of holes, said capacitors of each respective filter unit extending through respective holes of its associated said pair of holes with said second electrode thereof being in electrical contact with the hole through which it extends, said first and second legs of each respective filter unit extending through a respective hole of its associated said pair of holes, said filter unit being so oriented that every second filter unit has its ferrite bead located on a penetration shaft leg that is received in a hole of said first row and the remaining said filter units have their respective said ferrite bead located on a penetration shaft leg that is received in a hole of said second row, the spacing of said pairs of holes with respect to one another being sufficient to prevent the occurrence of any substantial inductive coupling between said filter units.

4. An electromagnetic interference suppression filter as claimed in claim 1 or 3, further comprising a shield member disposed on said metal plate and projecting therefrom between said rows of holes.

* * * * *